United States Patent
Pruitt et al.

(10) Patent No.: US 8,076,181 B1
(45) Date of Patent: Dec. 13, 2011

(54) LEAD PLATING TECHNIQUE FOR SINGULATED IC PACKAGES

(75) Inventors: David A. Pruitt, San Jose, CA (US); Lothar Maier, Pleasanton, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 12/910,676

(22) Filed: Oct. 22, 2010

(51) Int. Cl.
*H01L 21/50* (2006.01)
*H01L 21/48* (2006.01)
*H01L 21/44* (2006.01)
*H01L 21/46* (2006.01)

(52) U.S. Cl. ........ 438/111; 438/106; 438/123; 438/124; 438/127; 438/458; 257/E21.499; 257/E21.502; 257/E21.503; 257/E21.506; 257/E21.511

(58) Field of Classification Search ........... 257/E21.499, 257/E21.502, E21.503, E21.506, E21.511, 257/E21.514
See application file for complete search history.

(56) References Cited

U.S. PATENT DOCUMENTS

| | | | | |
|---|---|---|---|---|
| 6,573,123 B2 * | 6/2003 | Li et al. | ........ | 438/123 |
| 6,602,735 B2 * | 8/2003 | Shyu | ........ | 438/111 |
| 6,934,065 B2 * | 8/2005 | Kinsman | ........ | 359/245 |
| 7,122,401 B2 * | 10/2006 | Song | ........ | 438/108 |
| 2004/0214373 A1 * | 10/2004 | Jiang et al. | ........ | 438/110 |
| 2005/0085006 A1 * | 4/2005 | Voelz | ........ | 438/106 |
| 2009/0280603 A1 * | 11/2009 | Qiao et al. | ........ | 438/124 |

* cited by examiner

*Primary Examiner* — Mohsen Ahmadi
(74) *Attorney, Agent, or Firm* — Patent Law Group LLP; Brian D. Ogonowsky

(57) ABSTRACT

A packaging technique is described for QFNs, DFN, and other surface mount packages that allows the sides of leads to be plated with a wettable metal prior to the lead frames being singulated from the lead frame sheet. The leads of the lead frames in the sheet are shorted together and to the body of the lead frame sheet by a sacrificial interconnect structure. Chips are mounted to the lead frames and encapsulated, leaving the bottoms of the leads exposed. The lead frame sheet is then sawed along boundaries of the lead frames but not sawed through the interconnect structure. The sawing exposes at least a portion of the sides of the leads. The leads are then electroplated while the leads are biased with a bias voltage via the interconnect structure. After the plating, the lead frame sheet is sawed completely thorough the interconnect structure to singulate the lead frames and prevent the interconnect structure from shorting the leads together.

9 Claims, 5 Drawing Sheets

LEAD PLATING TECHNIQUE FOR SINGULATED IC PACKAGES

FIELD OF THE INVENTION

This invention relates to integrated circuit (IC) chip packages and, in particular, to a technique for plating sides of leads with a solder-wettable metal.

BACKGROUND

A conventional technique for packaging an IC chip in a surface mount package is as follows.

A copper lead frame sheet is stamped from a thin copper sheet. The lead frame sheet contains an array of connected lead frames that will be eventually singulated.

The areas of the lead frame sheet that are to be wire bonded are plated with silver or other suitable material that does not readily oxidize, unlike copper.

IC chips are then bonded to the center pads of each lead frame, and a bonding machine wire bonds the pads of the IC chips to the top surfaces of the leads of each lead frame.

The lead frame sheet and IC chips are then encapsulated with a suitable material, such as resin, epoxy, plastic, or other material. The encapsulation may be performed by molding. The bottom surfaces of the leads that are to be later soldered to a printed circuit board (PCB) are masked during the encapsulation step.

The exposed portions of the encapsulated lead frame sheet are then plated in an electroplating process with a wettable metal, such as tin or a tin-lead compound.

The individual lead frames are then singulated by sawing through the sheet at the lead frame boundaries. This results in exposed copper sides of the leads.

During soldering of the leads to a PCB, the solder will not wet to the copper sides of the leads due to the copper being oxidized, but the solder will wet to the bottom surfaces of the leads (which are flush against pads on the PCB) since the bottom surfaces were plated with the wettable metal.

For packages where the leads do not extend out beyond the package body, such as quad flat no-lead (QFN) packages, dual flat no-lead (DFN) packages, and certain other types of surface mount packages, it cannot be determine from a top down view or a perspective view whether there has been a solder connection to a lead under the package, since the solder does not wet the sides of the leads. Therefore, a visual inspection of the solder connections cannot be quickly performed.

What is needed is a packaging technique that allows the sides of leads to be plated with a wettable metal so that, after the lead frame is soldered to a PCB, the solder will wet the sides of the leads. This will greatly simplify visual inspection of the solder bonds.

SUMMARY

A packaging technique is described for QFNs, DFN, and other surface mount packages that allows the sides of leads to be plated with a wettable metal prior to the lead frames being singulated from the lead frame sheet.

One embodiment of the technique is as follows.

A conventional copper lead frame sheet is provided. IC chips are mounted on the lead frame sheet, and the pads of the IC chips are wire bonded to the tops of the leads of the lead frames.

The tops of the leads (which will face away from the PCB) are interconnected with sacrificial wires, or sacrificial copper strips, that short all the leads together as well as short the leads to the remainder of the copper lead frame sheet.

The bottom surfaces of the leads (which will face the PCB pads) are masked, such as by affixing a tape over the entire back surface of the lead frame sheet.

The lead frame sheet is then encapsulated, such as by using a molding process. As a result, a flat layer of the encapsulant is formed over substantially the entire top surface of the lead frame sheet and the IC chips.

The tape is then removed from the back surface of the lead frame sheet to expose the copper bottom surfaces of the leads.

A first sawing step is then performed along the boundaries of each lead frame in the lead frame sheet, which fully cuts through the copper lead frame but only partially cuts through the encapsulation. This first sawing step does not cut through the sacrificial wires or sacrificial copper strips that short the leads to the lead frame sheet. This first sawing step causes the copper sides of the leads to be exposed.

For electroplating, any portion of the lead frame sheet is coupled to a bias voltage, and the sacrificial wires or copper strips couple the bias voltage to all the cut lead frames. The exposed copper of the lead frame sheet is then electroplated in a solution to plate the copper with a solder-wettable metal, such as tin or a tin-lead compound. Therefore, the bottom and side of each lead is plated.

A second sawing step is then performed to cut through the remainder of the encapsulant and through the sacrificial wires or sacrificial copper strips to fully singulate the packages. Cutting through the sacrificial wires or sacrificial copper strips isolates the leads and makes the sacrificial wires or sacrificial copper strips functionally irrelevant.

Various embodiments are described.

BRIEF DESCRIPTION OF THE DRAWINGS

Elements that are the same or equivalent are labeled with the same numeral.

DETAILED DESCRIPTION

Figure 1:
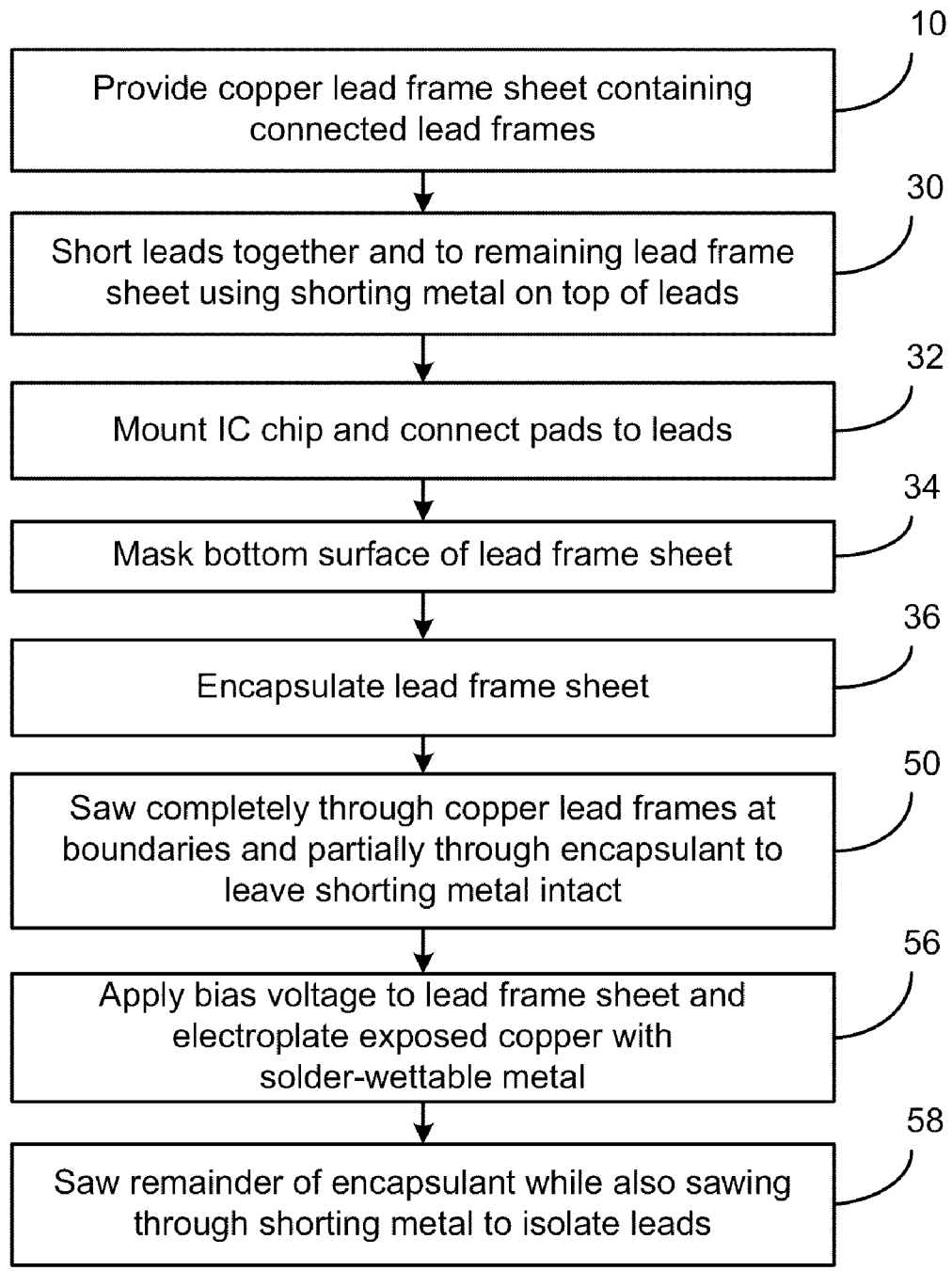
FIG. 1 is a flow chart of the inventive technique in accordance with one embodiment of the invention.

FIG. 1 is a flow chart of the inventive technique in accordance with one embodiment of the invention. The process will be described with reference to the examples shown in FIGS. 2-13, but the process may be applied to many more types of packages.

Figure 2:
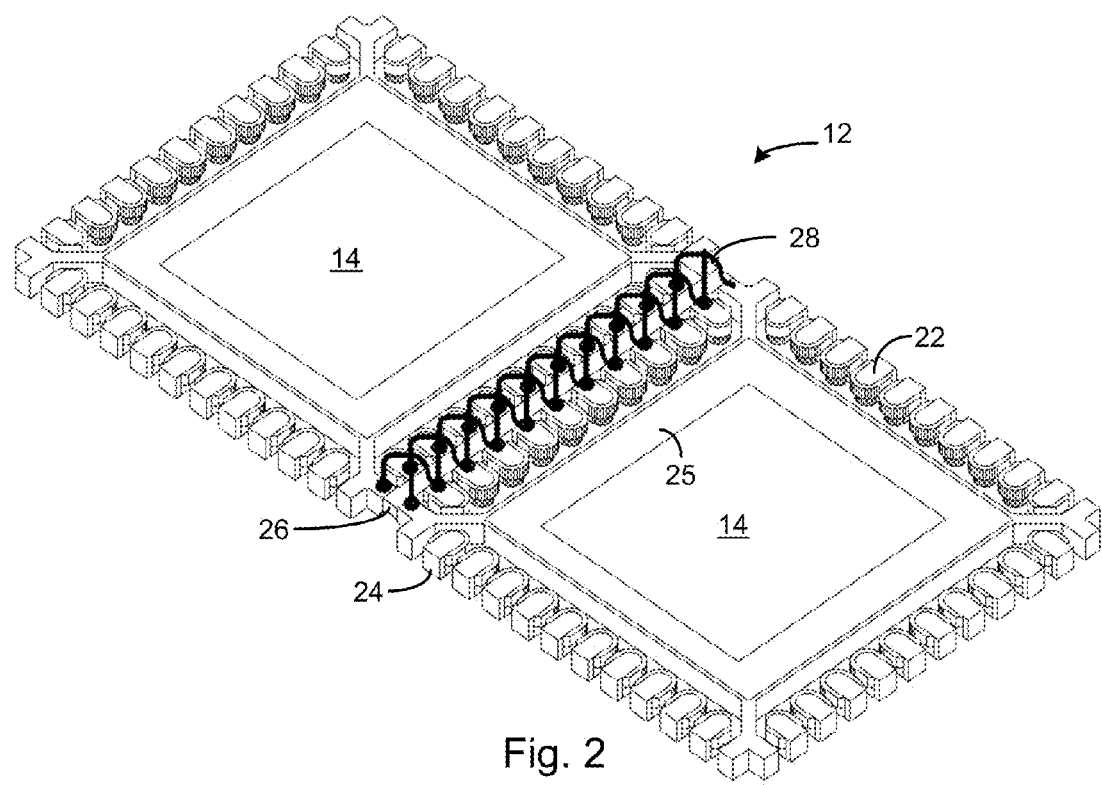
FIG. 2 is a perspective view of the top of a portion of a lead frame sheet after all leads have been shorted to each other by a pattern of shorting wires. Only one group of leads is shown interconnected for simplicity.

In step 10 of FIG. 1, a conventional copper lead frame sheet 12 (FIG. 2) is provided that comprises an N×M array of interconnected lead frames 14, where N and M are greater than one. FIG. 2 shows only two lead frames 14 for simplicity.

Standard thicknesses of such sheets 12 are between 0.1-0.2 mm. The lead frames 14 are eventually separated by sawing during singulation. Providing the lead frames 14 as a sheet of lead frames simplifies handling and processing of the packaging.

In the example, the tops 22 of the leads 24 are plated with silver to facilitate wire bonding to pads of an IC chip (not shown) later mounted on each lead frame 14. The peripheral portion 25 of each lead frame 14 is also plated with silver. The bottom surface of the IC chip will be thermally bonded to the copper middle portion of each lead frame 14 to sink heat from the chip.

As shown in FIG. 2, the leads 24 of adjacent lead frames 14 are connected together by a copper portion 26 of the sheet 12. During singulation, the copper portion 26 will be removed by sawing to isolate the leads 24 and physically separate the lead frames 14.

Figure 3:
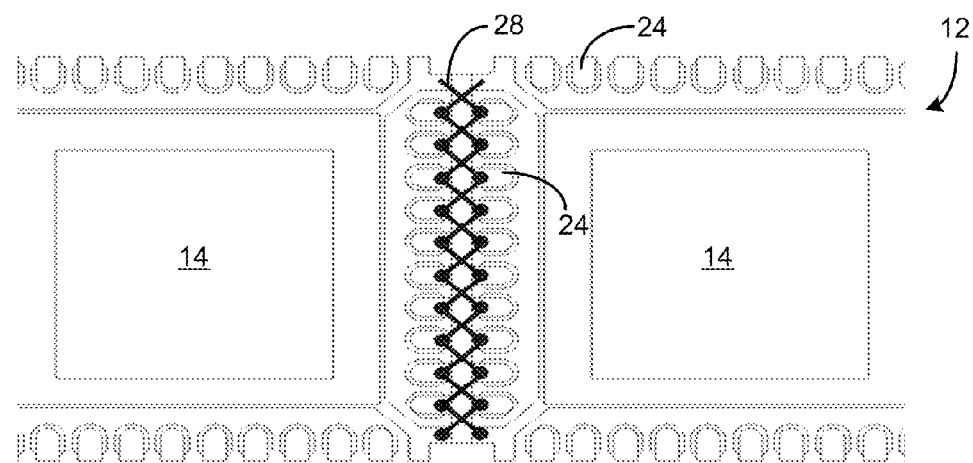
FIG. 3 is a top down view of FIG. 2.

In step 30, as part of the present invention, the leads 24 are shorted together by shorting wires 28 that are bonded to the tops 22 of the leads 24 using conventional bonding techniques, such as by ultrasonic welding, a conductive adhesive, solder, or other technique. The shorting wires 28 are also connected to portions of the lead frame sheet 12 that are not leads. The shorting wires 28 extend above the leads 24 so as not to be severed during a first sawing step described below. The wires 28 form a zig-zag pattern, as shown in FIG. 3, where there is a connection between crossing wires 28 at their midpoints, as shown in the side view of FIG. 4, so that all leads 24 are interconnected. The wires 28 are typically gold or copper.

Instead of shorting wires 28, any other type of shorting conductor may be used. FIGS. 8-13, described later, illustrate the use of copper shorting strips. Printed solder paste or other conductor may also be used.

Figure 5:
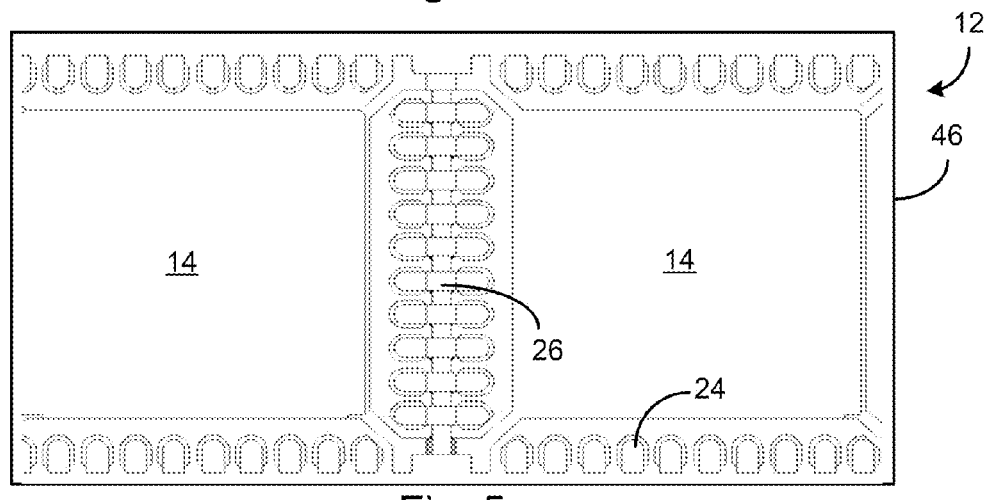
FIG. 5 is a bottom up view of FIG. 3.

FIG. 5 is a bottom up view of FIG. 3, showing how the lead frames 14 are interconnected by the copper portion 26 forming part of the lead frame sheet 12.

Steps 32, 34, and 36 in FIG. 1 are conventional and are not described in detail. In step 32, IC chips 40 (FIG. 4) are mounted on the lead frames 14, and wires 42 are connected between the pads of the chips 40 and the tops 22 of the corresponding leads 24 of the lead frames 14. The wires 42 may be connected by ultrasonic welding or other technique. This step may be performed before the shorting wires 28 are bonded to the leads 24. In another embodiment, thin metal strips may be used instead of wires, or other ways may be used to electrically connect the IC chips to the leads.

In step 34, the bottom surface of the lead frame sheet 12 is masked by, for example, a tape. FIG. 5 illustrates tape 46 covering the back surface of the sheet 12.

Figure 4:
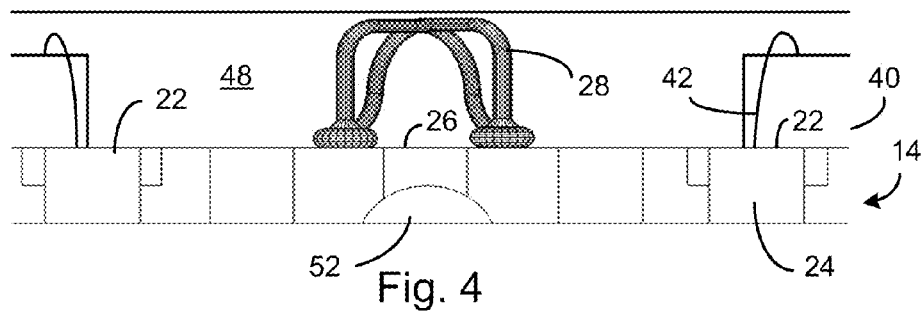
FIG. 4 is a side view showing a shorting wire.

In step 36, the lead frame sheet 12 is inserted into a mold and encapsulated using a suitable encapsulant, such as resin, plastic, or epoxy. FIG. 4 shows the top of the lead frame sheet 12 and IC chips 40 encapsulated by the encapsulant 48. The mask is then removed.

Figure 6:
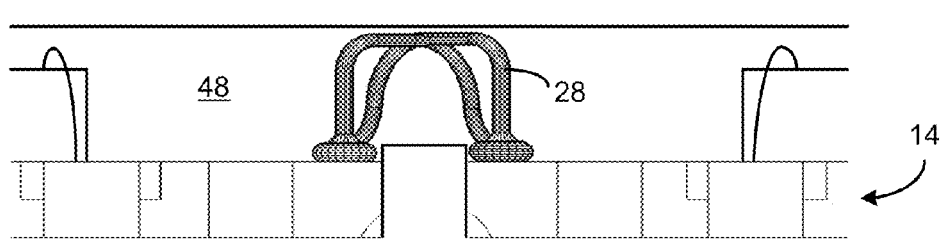
FIG. 6 is the side view of FIG. 4 after the first sawing step to cut the copper lead frame sheet.

In step 50, shown in FIG. 6, the lead frame sheet 12 is sawed completely through the lead frame sheet 12 along the boundaries of each lead frame 14. In one embodiment, the lead frame sheet 12 is provided with thinned areas 52 (see FIG. 4) defining the boundaries to simplify the sawing process. In one embodiment, the lead frame sheet 12 is about 0.2 mm thick, and the sawing is to a depth of between 0.25-0.3 mm.

In one embodiment, the saw has a width of 0.35 mm. The saw width and depth are sufficient to completely cut through the copper portion 26 that interconnects the lead frames 14 but the sawing does not cut the shorting wires 28. The lead frames 14 are mechanically connected by the encapsulant 48 and shorting wires 28. The copper sides of the leads 24 are now exposed.

In step 56, the resulting lead frame sheet 12 is connected to a bias voltage at any location and immersed in a solution (an electrolyte) for electroplating the exposed copper surfaces with a solder-wettable metal, such as matte-tin or a tin-lead compound. The electroplating may be conventional. The interconnections of the leads 24 to each other and to the remainder of the lead frame sheet 12 by the shorting wires 28 allows the leads 24 to be electrically biased (connected to a potential) during the plating process so that the exposed copper bottom and side surfaces of the leads 24 are plated with the solder-wettable material.

Figure 7:
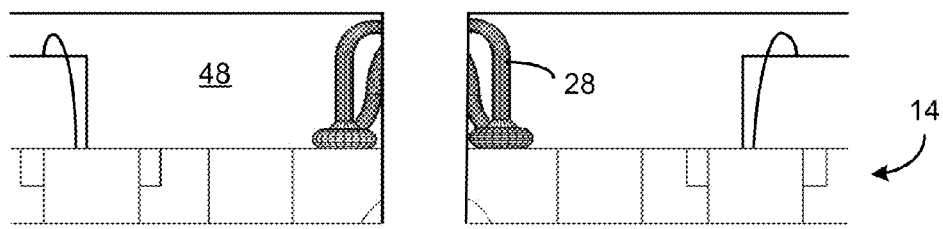
FIG. 7 is the side view of FIG. 6 after the leads have been plated and after the second sawing step to singulate the lead frames and cut through the shorting wires.

In step 58, shown in FIG. 7, another sawing step cuts completely through the encapsulant 48 and shorting wires 28 to complete the singulation. In one embodiment, the saw width is the same as or thinner than the saw width used in step 50. In step 58, the lead frame sheet 12 may be turned upside down for the sawing so that the saw does not need to extend through the plane of the copper lead frame sheet 12. This prevents the sawing from contacting the plated side surfaces of the leads 24.

The packaging process is complete.

FIGS. 8-13 illustrate copper strips being used as the shorting interconnect structure instead of wires 28.

Figure 8:
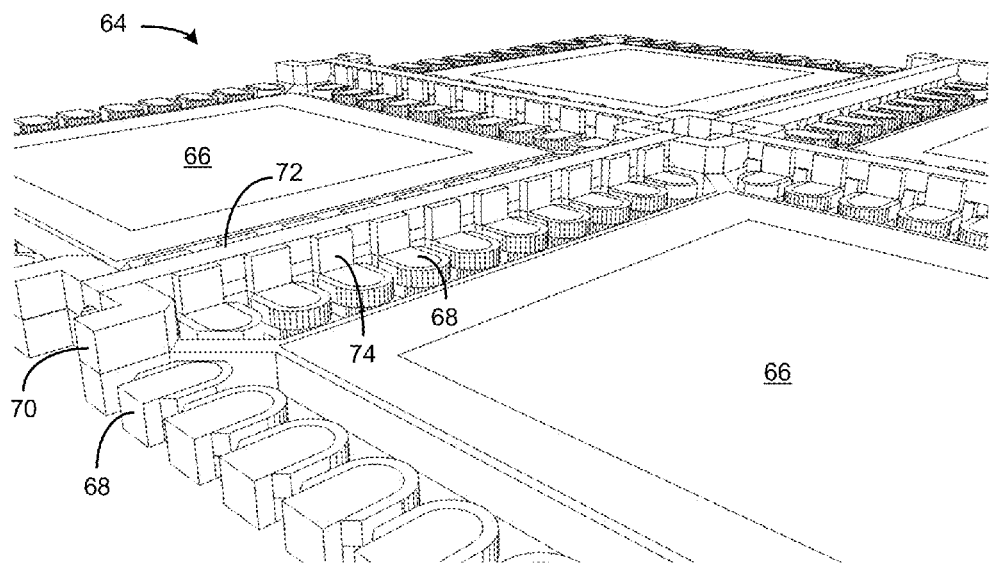
FIG. 8 is a perspective view of the top of a portion of a lead frame sheet after all leads have been shorted to each other by a pattern of shorting copper strips. Only one group of leads is shown interconnected for simplicity.

FIG. 8 is a perspective view of the top of a portion of a lead frame sheet 64, comprising an array of lead frames 66, after all leads 68 have been shorted to each other by a pattern of shorting copper strips 70. Each copper strip 70 has a central portion 72 and tabs 74 that extend over the tops of the leads 68. Only one group of leads 68 is shown interconnected for simplicity. The starting lead frame sheet 64 may be the same as the lead frame 12 used in FIGS. 2-7.

The copper strips 70 are part of an integral copper sheet that has been affixed over the lead frame sheet 64 by solder, a conductive adhesive, or other conductive material. The copper sheet and lead frame sheet 64 may be aligned by alignment holes in the copper sheet. The tabs 74 of each copper strip 70 overlie an edge of the leads 68 along adjacent rows of leads 68, and all the copper strips 70 are connected together by the copper sheet. Therefore, the copper strips 70 and copper sheet short all the leads 68 to each other and to the remainder of the lead frame sheet 64.

FIG. 8 represents step 30 in FIG. 1.

Figure 9:
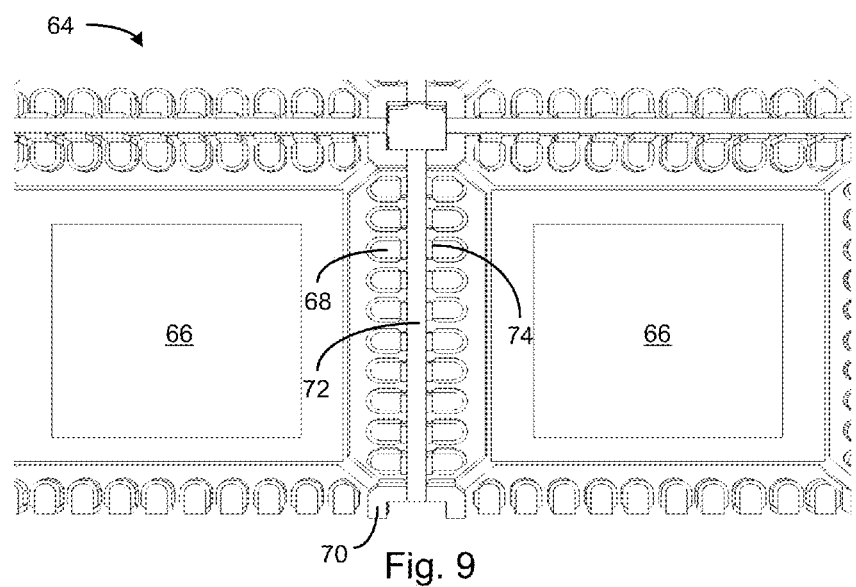
FIG. 9 is a top down view of FIG. 8.

FIG. 9 is a top down view of FIG. 8, showing the copper strips 70 having tabs 74 contacting the tops of the leads 68.

Figure 10:
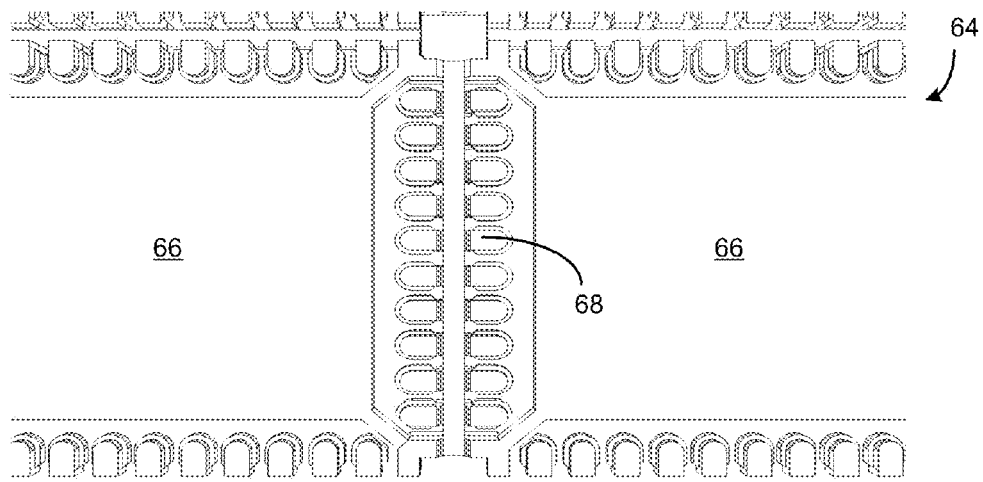
FIG. 10 is a bottom up view of FIG. 9.

FIG. 10 is a bottom up view of FIG. 9.

Figure 11:
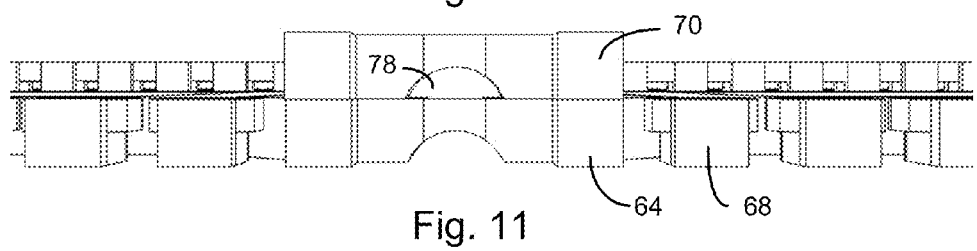
FIG. 11 is a side view of FIG. 8, looking at the end of the copper strip.

FIG. 11 is a side view of FIG. 8, looking at the end of the copper strip 70. The copper strip 70 has a thinned portion 78 along the boundaries of the lead frames 66.

Figure 12:
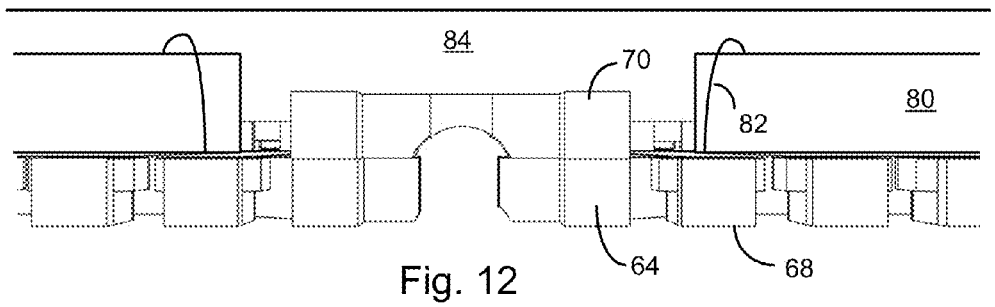
FIG. 12 is the side view of FIG. 11 after the first sawing step to cut the copper lead frame sheet.

As described in steps 32-36 of FIG. 1 and shown in FIG. 12, IC chips 80 are then mounted on the lead frames 66, and their pads are electrically connected to the tops of the corresponding leads 68 by wires 82. The bottom surface of the lead frame sheet 64 is then masked, and the lead frame sheet 64 and IC chips 80 are encapsulated in an encapsulant 84. The mask is then removed.

A first sawing step is then performed, as previously described with respect to step 50, to completely cut through the copper lead frame sheet 64 but not though the copper strips 70. FIG. 12 is the side view of FIG. 11 after the first sawing step to cut the copper lead frame sheet 64. The copper sides of the leads 68 are exposed after the sawing.

In step 56, the lead frame sheet 64 is biased with a bias voltage and then electroplated to plate the exposed bottom and side surfaces of the leads 68 with a solder-wettable metal, such as matte-tin or a tin-lead compound. The copper strips 70 allow the leads 68 and the remainder of the lead frame sheet 64 to be electrically biased during the electroplating by coupling a potential to any portion of the lead frame sheet 64.

Figure 13:
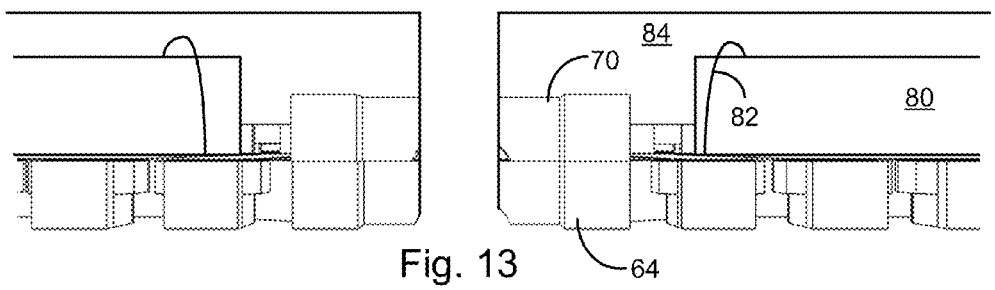
FIG. 13 is the side view of FIG. 11 after the leads have been plated and after the second sawing step to singulate the lead frames and cut through the shorting copper strip.

In step 58, a second sawing step is performed, as previously described, to saw completely through the remainder of the encapsulant 84 and through the copper strips 70 to electrically decouple the leads 68 from each other and the remainder of the lead frame sheet 64. FIG. 13 is the side view of FIG. 12 after the leads have been plated and after the second sawing step singulates the lead frames and cuts through the shorting copper strips 70.

The packaging process is complete.

In another embodiment, the copper sheet used for shorting the leads can instead be a solder paste or other conductive material printed (stenciled) over the lead frame sheet. Many other patterns and materials may be used for the sacrificial shorting layer over the lead frame sheet, and all such patterns and materials are derivatives of the invention.

The invention is particularly suitable for packages, such as QFN and DFN, where the leads do not extend beyond an outer boundary of the encapsulant. In QFN and DFN packages, the leads terminate at the boundaries of the encapsulant, and the sides of the leads are visible. By plating the sides of the leads with the solder-wettable metal, the molten solder during bonding to a PCB will wick up the sides of the leads. This will not only create an improved electrical connection between the PCB pads and the leads, but enables visual assurance that a solder connection has been made to each lead. Therefore, an automated visual inspection system can quickly determine, from a downward looking perspective, that there has been a soldered connection to each lead. In contrast, had the copper sides of the leads not been plated, no solder would be visible, and it could not be determined by looking down on the PCB that a solder connection was made.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A method for packaging chips comprising:
   providing a lead frame sheet comprising an array of interconnected lead frames, each lead frame having leads, bottom surfaces of the leads being for bonding to pads of a circuit board;
   shorting the leads of a first lead frame of the array of interconnected lead frames to a second lead frame of the array of interconnected lead frames by a sacrificial interconnect structure, the sacrificial interconnect structure contacting top surfaces of the leads, wherein the step of shorting the leads together by the sacrificial interconnect structure further comprises shorting the leads to a body of the lead frame sheet by the sacrificial interconnect structure;
   mounting chips to the lead frames and electrically connecting pads on the chips to corresponding leads;
   masking at least portions of the bottom surfaces of the leads with a mask;
   after the step of masking, encapsulating the chips and portions of the lead frame sheet, but not encapsulating the at least portions of the bottom surfaces of the leads;
   removing the mask;
   after removing the mask, a first sawing step of sawing through the lead frame sheet along boundaries of the lead frames but not sawing through the sacrificial interconnect structure, the sawing exposing at least a portion of sides of the leads;
   after the first step of sawing, biasing the lead frame sheet with a bias voltage, wherein the sacrificial interconnect structure couples the bias voltage to the leads of the lead frames;
   after the step of biasing the lead from sheet with the bias voltage, electroplating exposed bottom and side surfaces of the leads with a solder-wettable metal;
   after the step of electroplating, a second sawing step of sawing completely thorough the encapsulant and sacrificial interconnect structure to singulate the lead frames and prevent the sacrificial interconnect structure from shorting the leads of the first lead frame to the leads of the second lead frame; and
   wherein the each lead frame forms a surface mount package, where the leads do not extend beyond a boundary of a lead frame package body.

2. The method of claim 1 wherein the sacrificial interconnect structure comprises wires.

3. The method of claim 1 wherein the sacrificial interconnect structure comprises metal strips.

4. The method of claim 1 wherein the sacrificial interconnect structure comprises a conductive paste.

5. The method of claim 1 wherein the step of sawing completely through the encapsulant and sacrificial interconnect structure comprises sawing using a saw that has a thickness that is the same as or thinner than a saw used in the step of sawing through the lead frame sheet along boundaries of the lead frames but not sawing through the sacrificial interconnect structure.

6. The method of claim 1 wherein the sacrificial interconnect structure between two opposing lead frames in the lead frame sheet comprises a zig-zag structure of first and second wires, wherein leads diagonally across from each other are connected together by a first set of diagonal first wires angled in a first direction and also connected together by a second set of diagonal second wires angled in a second direction, wherein each first wire is bonded to an associated second wire at a midpoint of the first wire and second wire.

7. The method of claim 1 wherein the each lead frame forms a flat no-lead package.

8. The method of claim 1 wherein the each lead frame forms a quad flat no-lead package.

9. The method of claim 1 wherein the each lead frame forms a dual flat no-lead package.

* * * * *

UNITED STATES PATENT AND TRADEMARK OFFICE
CERTIFICATE OF CORRECTION

| | | |
|---|---|---|
| PATENT NO. | : 8,076,181 B1 | Page 1 of 1 |
| APPLICATION NO. | : 12/910676 | |
| DATED | : December 13, 2011 | |
| INVENTOR(S) | : David A. Pruitt et al. | |

It is certified that error appears in the above-identified patent and that said Letters Patent is hereby corrected as shown below:

Column 6
Line 25, Claim 1, where "completely thorough" should read --completely through--.

Signed and Sealed this
Seventh Day of February, 2012

David J. Kappos
*Director of the United States Patent and Trademark Office*